US012701919B2

(12) United States Patent
Shimoda

(10) Patent No.: US 12,701,919 B2
(45) Date of Patent: Aug. 4, 2026

(54) PIEZOELECTRIC ACTUATOR

(71) Applicant: KYOCERA Corporation, Kyoto (JP)

(72) Inventor: Tetsuya Shimoda, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 769 days.

(21) Appl. No.: 18/032,454

(22) PCT Filed: Oct. 14, 2021

(86) PCT No.: PCT/JP2021/038078
§ 371 (c)(1),
(2) Date: Apr. 18, 2023

(87) PCT Pub. No.: WO2022/085564
PCT Pub. Date: Apr. 28, 2022

(65) Prior Publication Data
US 2023/0397499 A1 Dec. 7, 2023

(30) Foreign Application Priority Data

Oct. 23, 2020 (JP) ................................. 2020-178467

(51) Int. Cl.
*H10N 30/20* (2023.01)
*H10N 30/50* (2023.01)
*H10N 30/87* (2023.01)

(52) U.S. Cl.
CPC ......... *H10N 30/2046* (2023.02); *H10N 30/50* (2023.02); *H10N 30/871* (2023.02); *H10N 30/872* (2023.02)

(58) Field of Classification Search
CPC .. H10N 30/2046; H10N 30/50; H10N 30/871; H10N 30/872; H10N 30/2023
See application file for complete search history.

(56) References Cited

U.S. PATENT DOCUMENTS

| | | | | |
|---|---|---|---|---|
| 4,868,447 A * | 9/1989 | Lee | ................... | H10N 30/2042 |
| | | | | 310/365 |
| 6,274,966 B1 | 8/2001 | Kohno et al. | | |
| 6,501,210 B1 * | 12/2002 | Ueno | .................... | B23Q 1/621 |
| 7,646,136 B2 * | 1/2010 | Adachi | ............. | H10N 30/2023 |
| | | | | 310/366 |
| 8,148,874 B2 * | 4/2012 | Xie | ................... | G02B 26/0866 |
| | | | | 359/848 |
| 8,421,308 B2 * | 4/2013 | Adachi | ............. | H10N 30/2023 |
| | | | | 310/323.12 |

(Continued)

FOREIGN PATENT DOCUMENTS

| | | | | |
|---|---|---|---|---|
| CN | 1547779 A | 11/2004 | | |
| CN | 106849741 B * | 2/2020 | ................ | B25J 9/12 |

(Continued)

*Primary Examiner* — Pedro J Cuevas
(74) *Attorney, Agent, or Firm* — Volpe Koenig

(57) ABSTRACT
A piezoelectric actuator includes a body portion including a layered piezoelectric element layered in a Y-axis direction of an orthogonal coordinate system XYZ, the body portion extending along a Z-axis direction. The body portion includes a first piezoelectric element that displaces a tip portion in an X-axis direction, a second piezoelectric element that displaces the tip portion in the Y-axis direction, and a third piezoelectric element that displaces the tip portion in the Z-axis direction.

4 Claims, 21 Drawing Sheets

(56)                 References Cited

U.S. PATENT DOCUMENTS

| | | | |
|---|---|---|---|
| 8,471,643 B2* | 6/2013 | Kim | H03H 9/2426 |
| | | | 331/107 A |
| 8,727,506 B2* | 5/2014 | Harigai | H10N 30/076 |
| | | | 347/68 |
| 8,816,567 B2* | 8/2014 | Zuo | H03H 3/02 |
| | | | 310/365 |
| 9,083,300 B2* | 7/2015 | Lo | H01P 1/2135 |
| 9,099,986 B2* | 8/2015 | Zuo | H03H 9/02228 |
| 9,270,254 B2* | 2/2016 | Zuo | H03H 9/2405 |
| 9,331,666 B2* | 5/2016 | Zuo | H03H 9/2405 |
| 10,497,854 B2* | 12/2019 | Arakawa | H10N 30/053 |
| 11,289,273 B2* | 3/2022 | Kim | H01G 4/012 |
| 11,540,033 B2* | 12/2022 | Scheller | H04R 17/00 |
| 11,689,179 B2* | 6/2023 | Tabrizian | H03H 9/02007 |
| | | | 181/175 |
| 12,418,251 B2* | 9/2025 | Nabavi | H02N 1/006 |
| 2004/0251771 A1 | 12/2004 | Dames | |
| 2009/0021114 A1* | 1/2009 | Adachi | H02N 2/004 |
| | | | 310/323.16 |
| 2009/0261688 A1* | 10/2009 | Xie | G02B 26/0866 |
| | | | 310/307 |
| 2011/0156536 A1* | 6/2011 | Adachi | H10N 30/50 |
| | | | 310/323.02 |
| 2012/0050236 A1* | 3/2012 | Lo | H01P 1/2135 |
| | | | 333/100 |
| 2012/0286886 A1* | 11/2012 | Kim | H03H 9/2426 |
| | | | 331/107 DP |
| 2012/0293520 A1* | 11/2012 | Yun | H03H 9/173 |
| | | | 310/321 |
| 2013/0021304 A1* | 1/2013 | Zuo | H03H 9/02228 |
| | | | 345/204 |
| 2013/0021305 A1* | 1/2013 | Zuo | H03H 3/02 |
| | | | 29/25.35 |
| 2013/0038666 A1* | 2/2013 | Harigai | G01C 19/5628 |
| | | | 73/504.12 |
| 2013/0082799 A1* | 4/2013 | Zuo | H03H 9/462 |
| | | | 333/189 |
| 2013/0083044 A1* | 4/2013 | Zuo | H03H 9/2405 |
| | | | 310/365 |
| 2013/0120081 A1* | 5/2013 | Zuo | H03H 9/564 |
| | | | 333/186 |
| 2013/0120415 A1* | 5/2013 | Zuo | H03H 9/02228 |
| | | | 427/79 |

| | | | |
|---|---|---|---|
| 2013/0135264 A1* | 5/2013 | Black | H03H 9/178 |
| | | | 216/13 |
| 2013/0214643 A1* | 8/2013 | Zuo | H10N 30/852 |
| | | | 29/25.35 |
| 2014/0111064 A1* | 4/2014 | Zuo | H03H 9/205 |
| | | | 310/365 |
| 2015/0270068 A1* | 9/2015 | Hattori | H01C 1/14 |
| | | | 361/301.4 |
| 2016/0049247 A1* | 2/2016 | Kitano | H01G 4/232 |
| | | | 361/301.4 |
| 2016/0049255 A1* | 2/2016 | Sugita | H01G 4/232 |
| | | | 361/301.4 |
| 2017/0105294 A1* | 4/2017 | Shimoda | H04M 1/02 |
| 2020/0082979 A1* | 3/2020 | Kim | H05K 3/301 |
| 2020/0090864 A1* | 3/2020 | Kim | H01G 4/002 |
| 2020/0202832 A1* | 6/2020 | Tabrizian | G10K 11/22 |
| 2021/0175018 A1* | 6/2021 | Kim | H01G 2/06 |
| 2022/0186174 A1* | 6/2022 | Lipkens | C12M 47/02 |
| 2022/0353592 A1* | 11/2022 | Scheller | B06B 1/0629 |
| 2023/0042123 A1* | 2/2023 | Nabavi | H02N 1/008 |
| 2023/0096205 A1* | 3/2023 | Scheller | B06B 1/0629 |
| | | | 381/190 |
| 2023/0320220 A1 | 10/2023 | Namba | |
| 2024/0010489 A1* | 1/2024 | Riani | H10N 30/306 |
| 2025/0015779 A1* | 1/2025 | Yamaji | H03H 9/25 |
| 2025/0196189 A1* | 6/2025 | Yoshida | G08B 6/00 |
| 2025/0350260 A1* | 11/2025 | McGann | H03H 9/02551 |

FOREIGN PATENT DOCUMENTS

| | | | | |
|---|---|---|---|---|
| CN | 116326256 A | * | 6/2023 | H10N 30/50 |
| EP | 0923144 A2 | | 6/1999 | |
| EP | 3491732 B1 | * | 11/2019 | H02N 2/004 |
| EP | 4177976 A1 | | 5/2023 | |
| EP | 4235828 A1 | * | 8/2023 | H10N 30/50 |
| JP | H02-143475 A | | 6/1990 | |
| JP | 11-094865 A | | 4/1999 | |
| JP | 2004-531189 A | | 10/2004 | |
| JP | 4240472 B2 | * | 3/2009 | G02B 6/3578 |
| JP | 2011135711 A | * | 4/2011 | H02N 2/004 |
| JP | 7596398 B2 | * | 12/2024 | H10N 30/872 |
| KR | 10-2013-0056754 A | | 5/2013 | |
| KR | 101701330 B1 | * | 2/2017 | H03H 9/02574 |
| WO | WO-2014065939 A1 | * | 5/2014 | H03H 9/2405 |
| WO | WO-2018019892 A1 | * | 2/2018 | H02N 2/004 |
| WO | WO-2022085564 A1 | * | 4/2022 | H10N 30/50 |

* cited by examiner

PIEZOELECTRIC ACTUATOR

CROSS-REFERENCE TO RELATED APPLICATIONS

This application is national stage application of International Application No. PCT/JP2021/038078 filed on Oct. 14, 2021, which designates the United States, incorporated herein by reference, and which claims the benefit of priority from Japanese Patent Application No. 2020-178467, filed on Oct. 23, 2020 the entire contents of which are incorporated herein by reference.

TECHNICAL FIELD

The disclosed embodiments relate to a piezoelectric actuator.

BACKGROUND OF INVENTION

In the related art, in a piezoelectric actuator extending in a rod shape, a technique is known in which a tip portion can be displaced in a direction substantially perpendicular to an extending direction by selectively applying a voltage to a plurality of terminals (for example, see Patent Document 1).

CITATION LIST

Patent Literature

Patent Document 1: JP 2004-531189 T

SUMMARY

An object of one aspect of the embodiments is to provide a more user-friendly piezoelectric actuator.

Solution to Problem

A piezoelectric actuator according to an aspect of an embodiment includes a body portion including a layered piezoelectric element layered in a Y-axis direction of an orthogonal coordinate system XYZ, the body portion extending along a Z-axis direction. The body portion includes a first piezoelectric element that displaces a tip portion in an X-axis direction, a second piezoelectric element that displaces the tip portion in the Y-axis direction, and a third piezoelectric element that displaces the tip portion in the Z-axis direction.

DESCRIPTION OF EMBODIMENTS

Hereinafter, embodiments of a piezoelectric actuator disclosed in the present application will be described with reference to the accompanying drawings. Note that the present disclosure is not limited to the embodiments described below. Note that the drawings are schematic and that the dimensional relationships between elements, the proportions thereof, and the like may differ from the actual ones. The drawings may include portions having different dimensional relationships or ratios.

In the related art, in a piezoelectric actuator extending in a rod shape, a technique is known in which a tip portion can be displaced in a direction substantially perpendicular to an extending direction by selectively applying a voltage to a plurality of terminals.

However, in the related art, the direction in which the tip portion can be displaced is limited, leaving room for further improvement in the usability of the piezoelectric actuator.

Therefore, it is hoped that a technique capable of overcoming the above-described problem and suppressing the usability of the piezoelectric actuator from being further improved will be realized.

Overall Configuration of Piezoelectric Actuator

Figure 1:
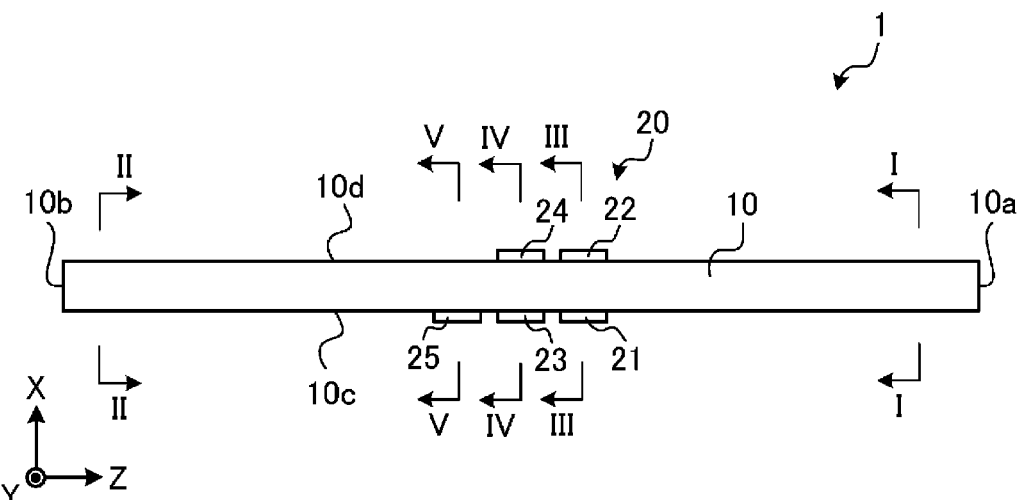
FIG. 1 is a top view illustrating an overall configuration of a piezoelectric actuator according to an embodiment.
Figure 2:
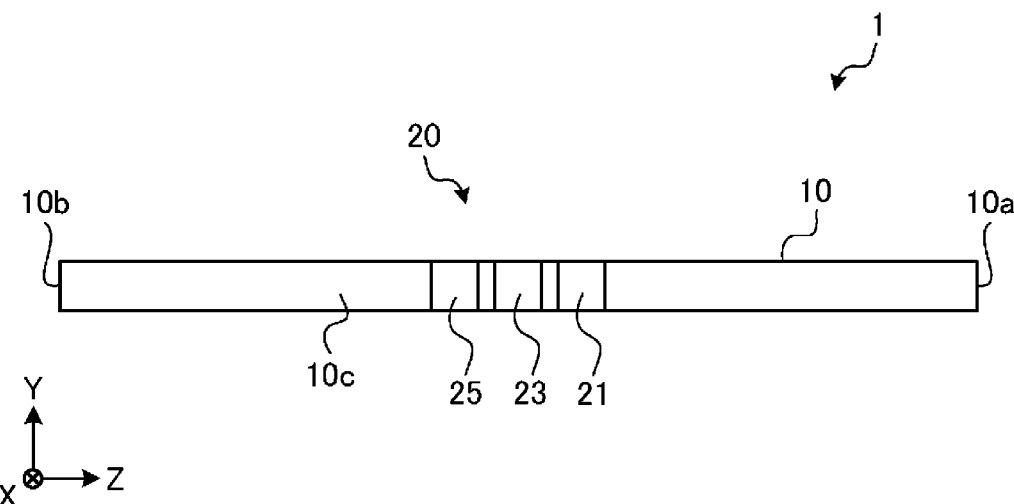
FIG. 2 is a side view illustrating an overall configuration of the piezoelectric actuator according to the embodiment.

First, an overall configuration of a piezoelectric actuator 1 according to an embodiment will be described with reference to FIGS. 1 and 2. FIG. 1 is a top view illustrating the overall configuration of the piezoelectric actuator 1 according to the embodiment, and FIG. 2 is a side view illustrating the overall configuration of the piezoelectric actuator 1 according to the embodiment. In the following description, in order to clarify the positional relationship, an X-axis, a Y-axis, and a Z axis orthogonal to each other are defined.

As illustrated in FIGS. 1 and 2, the piezoelectric actuator 1 according to the embodiment includes a body portion 10 and a terminal portion 20. The body portion 10 is a rod-like (for example, rectangular parallelepiped) portion extending along the Z-axis direction, and has a tip portion 10a, which is an end portion on the Z-axis positive direction side, and a base end portion which is an end portion on the Z-axis negative direction side.

The body portion 10 includes a layered piezoelectric element including a piezoelectric layer 9 (see FIG. 3A) and internal electrode layers A to E (see FIG. 3A to FIG. 3E), and layered in the Y-axis direction. The details of the layered piezoelectric element will be described below.

The terminal portion 20 supplies a drive voltage from the outside to the layered piezoelectric element of the body portion 10. The terminal portion 20 according to the embodiment includes five terminals 21 to 25. As illustrated in FIG. 1, the five terminals 21 to 25 are disposed in the vicinity of a central portion in the extending direction (that is, the Z-axis direction) of the body portion 10.

The terminals 21, 23, and 25 are disposed on a side surface 10c of the body portion 10 on the X-axis negative direction side, and the terminals 22 and 24 are disposed on a side surface 10d of the body portion 10 on the X-axis positive direction side. The terminals 21, 23, and 25 are disposed side by side in this order from the tip portion 10a side along the Z-axis direction, and the terminals 22 and 24 are disposed side by side in this order from the tip portion 10a side along the Z-axis direction.

The terminal 21 and the terminal 22 are disposed side by side along the X-axis direction, and the terminal 23 and the terminal 24 are disposed side by side along the X-axis direction.

The material of the terminals 21 to 25 is, for example, a metal such as copper, iron, stainless steel, or phosphor bronze, and the thickness of the terminals 21 to 25 is, for example, from 0.01 (mm) to 1.0 (mm). A plating film such as tin plating or silver plating may be provided on the surface of each of the terminals 21 to 25 in order to improve electrical conductivity and thermal conductivity.
Internal Configuration of Body Portion Next, an internal configuration of the body portion 10 according to the embodiment will be described with reference to FIGS. 3A to 10. First, the configuration of the piezoelectric layer 9 and the internal electrode layers A to E constituting the layered piezoelectric element of the body portion 10 will be described with reference to FIGS. 3A and 3E.

Figure 3A:
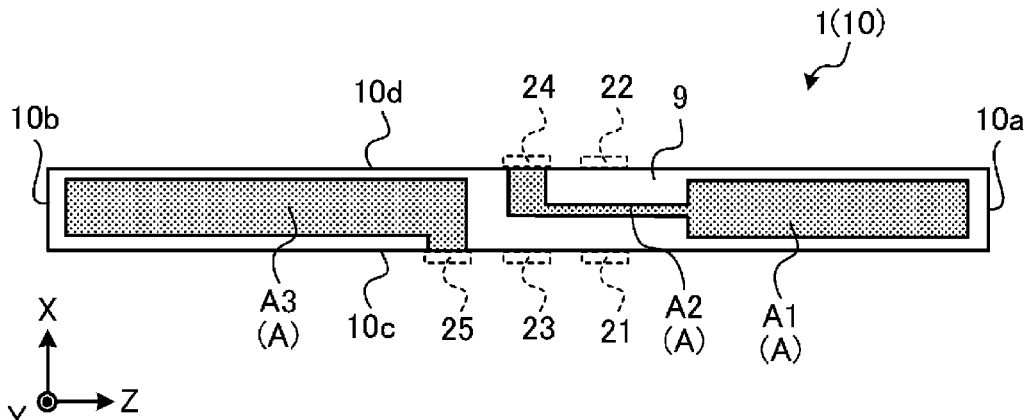
FIG. 3A is a diagram illustrating a configuration of an internal electrode layer of a body portion according to the embodiment.

FIG. 3A is a view illustrating the configuration of the internal electrode layer A of the body portion 10 according to the embodiment. As illustrated in FIG. 3A, the internal electrode layer A is layered along the Y-axis direction on the rectangular piezoelectric layer 9 located along the XZ plane.

The internal electrode layer A has internal electrode layers A1 to A3. The internal electrode layer A1 is a wide portion formed from the tip portion 10a to a position just before a portion where the terminals 21 and 22 are disposed. The internal electrode layer A1 extends, for example, from the vicinity of the side surface 10c to the vicinity of the side surface 10d in the X-axis direction.

The internal electrode layer A2 is a narrow portion extending from an end portion of the internal electrode layer A1 on the Z-axis negative direction side to the terminal 24, and electrically connects the internal electrode layer A1 and the terminal 24. The internal electrode layer A2 is located, for example, in an intermediate portion between the side surface 10c and the side surface in the X-axis direction.

The internal electrode layer A3 is a wide portion formed between a portion where a terminal 25 is disposed and the base end portion 10b, and is electrically connected to the terminal 25. The internal electrode layer A3 extends, for example, from the vicinity of the side surface 10c to the vicinity of the side surface 10d in the X-axis direction.

The piezoelectric layer 9 is made of a piezoelectric material having piezoelectric characteristics, for example, a piezoelectric ceramic. The material of the piezoelectric ceramic is, for example, a perovskite-type oxide made of lead zirconate titanate ($PbZrO_3$—$PbTiO_3$), lithium niobate ($LiNbO_3$), or lithium tantalate ($LiTaO_3$).

The average particle diameter of the piezoelectric ceramic is, for example, 1.6 (μm) to 2.8 (μm). The thickness of the piezoelectric layer 9 is, for example, 3 (μm) to 250 (μm).

The material of the internal electrode layers A to E is, for example, a metal containing silver, silver-palladium, silver-platinum, copper, or the like as a main component. The internal electrode layers A to E can be formed by, for example, co-firing with the piezoelectric layer 9. The thickness of the internal electrode layers A to E is, for example, 0.1 (μm) to 5 (μm).

Figure 3B:
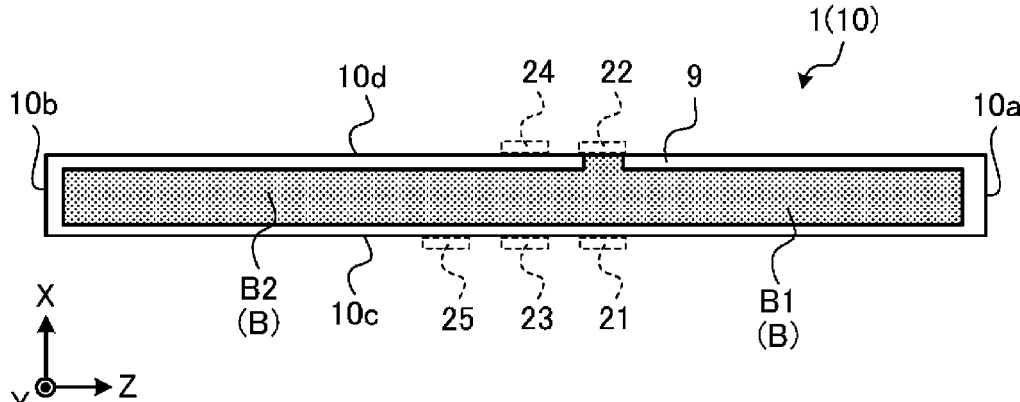
FIG. 3B is a diagram illustrating the configuration of the internal electrode layer of the body portion according to the embodiment.

FIG. 3B is a view illustrating the configuration of the internal electrode layer B of the body portion 10 according to the embodiment. As illustrated in FIG. 3B, the internal electrode layer B is layered along the Y-axis direction on the rectangular piezoelectric layer 9 located along the XZ plane.

The internal electrode layer B includes internal electrode layers B1 and B2. The internal electrode layer B1 is a wide portion formed from the tip portion 10a to a portion where the terminals 21 and 22 are disposed, and is electrically connected to the terminal 22. The internal electrode layer B1 extends, for example, from the vicinity of the side surface 10c to the vicinity of the side surface 10d in the X-axis direction.

The internal electrode layer B2 is a wide portion formed between a portion where the terminals 21 and 22 are disposed and the base end portion 10b, and is electrically connected to the terminal 22. The internal electrode layer B2 extends, for example, from the vicinity of the side surface 10c to the vicinity of the side surface 10d in the X-axis direction.

As described above, the internal electrode layers B1 and B2 are electrically connected to the terminal 22, and are integrally formed on substantially the entire surface of the rectangular piezoelectric layer 9.

Figure 3C:
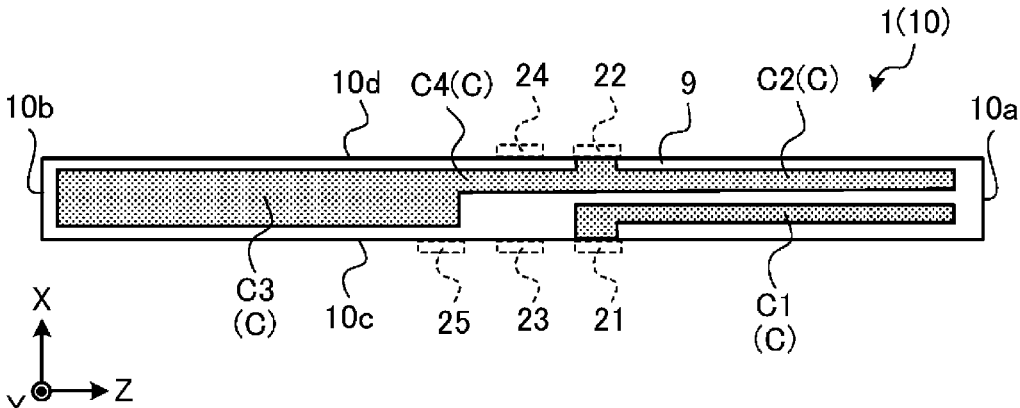
FIG. 3C is a diagram illustrating the configuration of the internal electrode layer of the body portion according to the embodiment.

FIG. 3C is a view illustrating the configuration of the internal electrode layer C of the body portion 10 according to the embodiment. As illustrated in FIG. 3C, the internal electrode layer C is layered along the Y-axis direction on the rectangular piezoelectric layer 9 located along the XZ plane.

The internal electrode layer C includes internal electrode layers C1 to C4. The internal electrode layer C1 is a slightly narrow portion formed between the tip portion 10a and a portion where the terminals 21 and 22 are disposed, and is electrically connected to the terminal 21. The internal electrode layer C1 extends, for example, in the X-axis direction, from an intermediate portion between the side surface 10c and the side surface 10d to the vicinity of the side surface 10c.

The internal electrode layer C2 is a slightly narrow portion formed between the tip portion 10a and a portion where the terminals 21 and 22 are disposed, and is electrically connected to the terminal 22. The internal electrode layer C2 extends, for example, in the X-axis direction, from an intermediate portion between the side surface 10c and the side surface 10d to the vicinity of the side surface 10d.

The internal electrode layer C3 is a wide portion formed between a portion where the terminal 25 is disposed and the base end portion 10b. The internal electrode layer C3 extends, for example, from the vicinity of the side surface 10c to the vicinity of the side surface 10d in the X-axis direction.

The internal electrode layer C4 is a slightly narrow portion extending from an end portion of the internal electrode layer C2 on the Z-axis negative direction side to an end portion of the internal electrode layer C3 on the Z-axis positive direction side, and electrically connects the internal electrode layer C3 and the terminal 22. The internal electrode layer C4 extends from an intermediate portion between the side surface 10c and the side surface 10d to the vicinity of the side surface 10d.

Figure 3D:
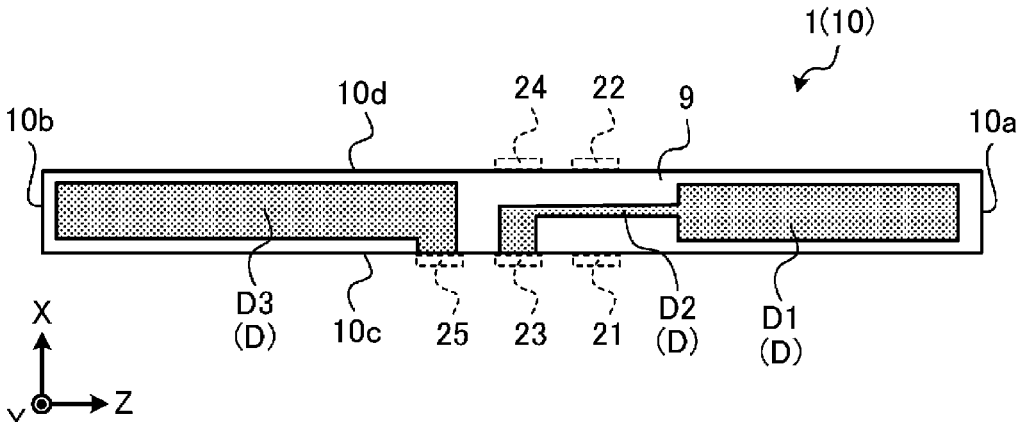
FIG. 3D is a diagram illustrating the configuration of the internal electrode layer of the body portion according to the embodiment.

FIG. 3D is a view illustrating the configuration of the internal electrode layer D of the body portion 10 according to the embodiment. As illustrated in FIG. 3D, the internal electrode layer D is layered along the Y-axis direction on the rectangular piezoelectric layer 9 located along the XZ plane.

The internal electrode layer D includes internal electrode layers D1 to D3. The internal electrode layer D1 is a wide portion formed from the tip portion 10a to a position just before a portion where the terminals 21 and 22 are disposed. The internal electrode layer D1 extends, for example, from the vicinity of the side surface 10c to the vicinity of the side surface 10d in the X-axis direction.

The internal electrode layer D2 is a narrow portion extending from an end portion of the internal electrode layer D1 on the Z-axis negative direction side to the terminal 23, and electrically connects the internal electrode layer D1 and the terminal 23. The internal electrode layer D2 is located, for example, in an intermediate portion between the side surface 10c and the side surface in the X-axis direction.

The internal electrode layer D3 is a wide portion formed between a portion where the terminal 25 is disposed and the base end portion 10b, and is electrically connected to the terminal 25. The internal electrode layer D3 extends, for example, from the vicinity of the side surface 10c to the vicinity of the side surface 10d in the X-axis direction.

Figure 3E:
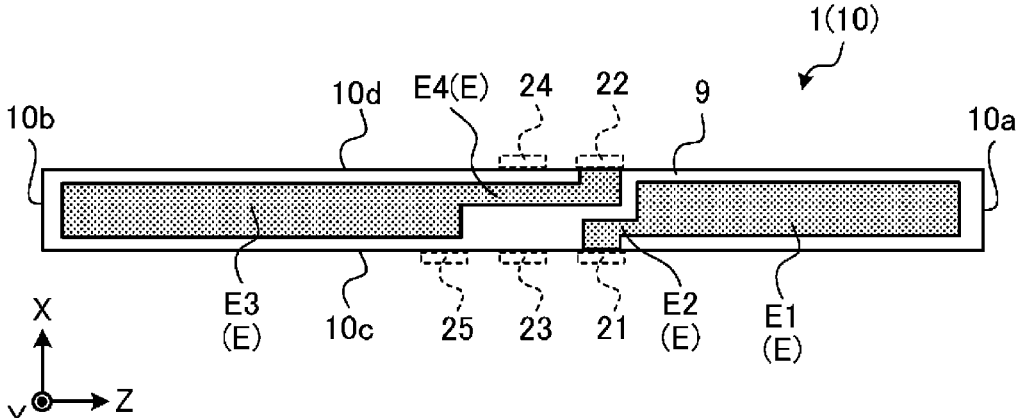
FIG. 3E is a diagram illustrating the configuration of the internal electrode layer of the body portion according to the embodiment.

FIG. 3E is a view illustrating the configuration of the internal electrode layer E of the body portion 10 according to the embodiment. As illustrated in FIG. 3E, the internal electrode layer E is layered along the Y-axis direction on the rectangular piezoelectric layer 9 located along the XZ plane.

The internal electrode layer E includes internal electrode layers E1 to E4. The internal electrode layer E1 is a wide portion formed from the tip portion 10a to a position just before a portion where the terminals 21 and 22 are disposed.

The internal electrode layer E1 extends, for example, from the vicinity of the side surface 10c to the vicinity of the side surface 10d in the X-axis direction.

The internal electrode layer E2 is a slightly narrow portion extending from an end portion of the internal electrode layer E1 on the Z-axis negative direction side to the terminal 21, and electrically connects the internal electrode layer E1 and the terminal 21. The internal electrode layer E2 extends, for example, in the X-axis direction, from an intermediate portion between the side surface 10c and the side surface 10d to the vicinity of the side surface 10c.

The internal electrode layer E3 is a wide portion formed between a portion where the terminal 25 is disposed and the base end portion 10b. The internal electrode layer E3 extends, for example, from the vicinity of the side surface 10c to the vicinity of the side surface 10d in the X-axis direction.

The internal electrode layer E4 is a slightly narrow portion extending from a portion where the terminal 22 is disposed to an end portion of the internal electrode layer E3 on the Z-axis positive direction side, and electrically connects the internal electrode layer E3 and the terminal 22. The internal electrode layer E4 extends, for example, from an intermediate portion between the side surface 10c and the side surface 10d to the vicinity of the side surface 10d.

Next, details of the layered piezoelectric element of the body portion 10 including the piezoelectric layer 9 and the internal electrode layers A to E described above will be described with reference to FIGS. 4 to 10.

Figure 4:
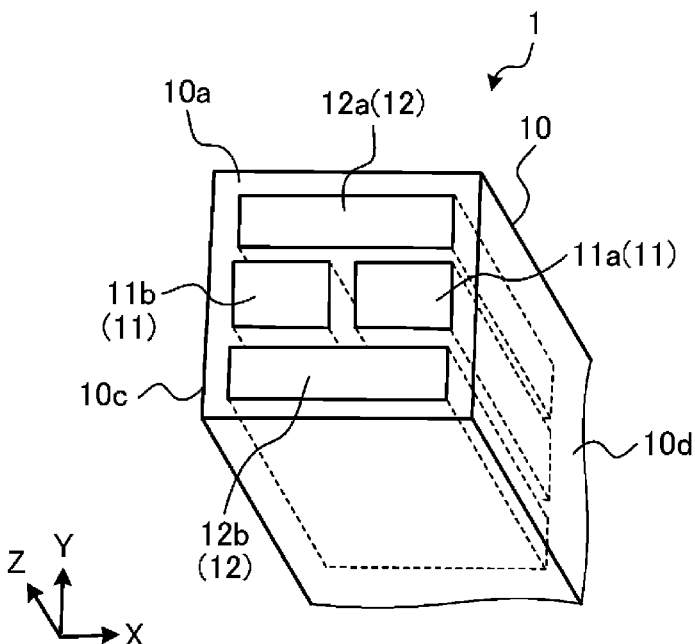
FIG. 4 is an enlarged perspective view illustrating a configuration of a tip portion side of the body portion according to the embodiment.
Figure 5:
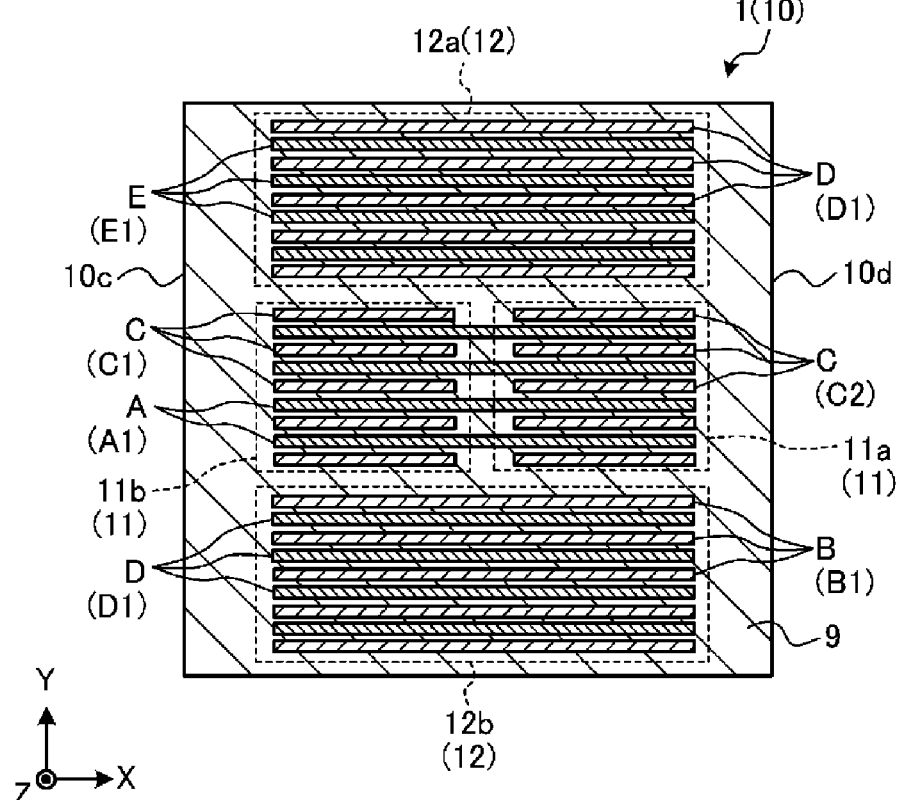
FIG. 5 is a cross-sectional view illustrating the configuration of the tip portion side of the body portion according to the embodiment.

FIG. 4 is an enlarged perspective view illustrating the configuration of the body portion 10 on the tip portion 10a side according to the embodiment, and FIG. 5 is a cross-sectional view illustrating the configuration of the body portion 10 on the tip portion 10a side according to the embodiment. FIG. 5 is a cross-sectional view taken along line I-I of FIG. 1.

As illustrated in FIG. 4, the body portion 10 according to the embodiment includes a first piezoelectric element 11 and a second piezoelectric element 12. The first piezoelectric element 11 and the second piezoelectric element 12 are disposed on the tip portion 10a side of the body portion 10.

The first piezoelectric element 11 is a piezoelectric element that displaces the tip portion 10a of the body portion 10 in the X-axis direction, and includes a first element 11a and a second element 11b. The first element 11a is disposed on the X-axis positive direction side (that is, the side surface 10d side), and the second element 11b is disposed on the X-axis negative direction side (that is, the side surface 10c side).

The second piezoelectric element 12 is a piezoelectric element that displaces the tip portion 10a of the body portion 10 in the Y-axis direction, and includes a first element 12a and a second element 12b. The first element 12a is disposed on the Y-axis positive direction side, and the second element 12b is disposed on the Y-axis negative direction side.

As illustrated in FIG. 5, the body portion 10 is formed by layering the piezoelectric layer 9 and the internal electrode layers A to E in a predetermined order along the Y-axis direction. To be specific, the first element 12a of the second piezoelectric element 12 is formed by repeatedly layering the piezoelectric layer 9, the internal electrode layer D, the piezoelectric layer 9, and the internal electrode layer E in this order from the Y-axis positive direction side in the body portion 10. The first element 12a includes the piezoelectric layer 9, the internal electrode layer D1, and the internal electrode layer E1.

Following the first element 12a, the first element 11a and the second element 11b of the first piezoelectric element 11 are formed by repeatedly layering the piezoelectric layer 9, the internal electrode layer C, the piezoelectric layer 9, and the internal electrode layer A in this order.

The first element 11a includes the piezoelectric layer 9, the internal electrode layer C2, and the internal electrode layer A1. The second element 11b includes the piezoelectric layer 9, the internal electrode layer C1, and the internal electrode layer A1.

Further, following the first piezoelectric element 11, the second element 12b of the second piezoelectric element 12 is formed by repeatedly layering the piezoelectric layer 9, the internal electrode layer B, the piezoelectric layer 9, and the internal electrode layer D in this order. The second element 12b includes the piezoelectric layer 9, the internal electrode layer B1, and the internal electrode layer D1.

In the piezoelectric actuator 1 described above, by supplying a predetermined drive voltage to the terminal 22 (see FIG. 1) and the terminal 24 (see FIG. 1), the drive voltage is applied between the internal electrode layer C2 and the internal electrode layer A1.

That is, by supplying a drive voltage to the terminals 22 and 24, the drive voltage is applied to the first element 11a of the first piezoelectric element 11 in which the internal electrode layer C2 and the internal electrode layer A1 are alternately layered. As a result, the first element 11a extends in the Y-axis direction and contracts in the Z-axis direction, so that in the piezoelectric actuator 1, the tip portion 10a of the body portion 10 is displaced to the X-axis positive direction side.

In the piezoelectric actuator 1 according to the embodiment, a predetermined drive voltage is supplied to the terminal 21 (see FIG. 1) and the terminal 24, so that the drive voltage is applied between the internal electrode layer C1 and the internal electrode layer A1.

That is, by supplying a drive voltage to the terminals 21 and 24, the drive voltage is applied to the second element 11b of the first piezoelectric element 11 in which the internal electrode layer C1 and the internal electrode layer A1 are alternately layered. As a result, the second element 11b extends in the Y-axis direction and contracts in the Z-axis direction, so that in the piezoelectric actuator 1, the tip portion 10a of the body portion 10 is displaced to the X-axis negative direction side.

In this manner, in the embodiment, by selectively applying a voltage to the terminals 21, 22, and 24, the tip portion 10a is independently displaced in the X-axis direction.

In the piezoelectric actuator 1 according to the embodiment, a predetermined drive voltage is supplied to the terminals 21 and the terminals 23 (see FIG. 1), so that the drive voltage is applied between the internal electrode layer D1 and the internal electrode layer E1.

That is, by supplying a drive voltage to the terminals 21 and 23, the drive voltage is applied to the first element 12a of the second piezoelectric element 12 in which the internal electrode layer D1 and the internal electrode layer E1 are alternately layered. As a result, the first element 12a extends in the Y-axis direction and contracts in the Z-axis direction, so that in the piezoelectric actuator 1, the tip portion 10a of the body portion 10 is displaced to the Y-axis positive direction side.

In the piezoelectric actuator 1 according to the embodiment, a predetermined drive voltage is supplied to the terminal 22 and the terminal 23, so that the drive voltage is applied between the internal electrode layer B1 and the internal electrode layer D1.

That is, by supplying a drive voltage to the terminals 22 and 23, the drive voltage is applied to the second element 12b of the second piezoelectric element 12 in which the internal electrode layer B1 and the internal electrode layer D1 are alternately layered. As a result, the second element 12b extends in the Y-axis direction and contracts in the Z-axis direction, so that in the piezoelectric actuator 1, the tip portion 10a of the body portion 10 is displaced in the Y-axis negative direction.

In this manner, in the embodiment, by selectively applying a voltage to the terminals 21 to 23, the tip portion 10a is independently displaced in the Y-axis direction.

Figure 6:
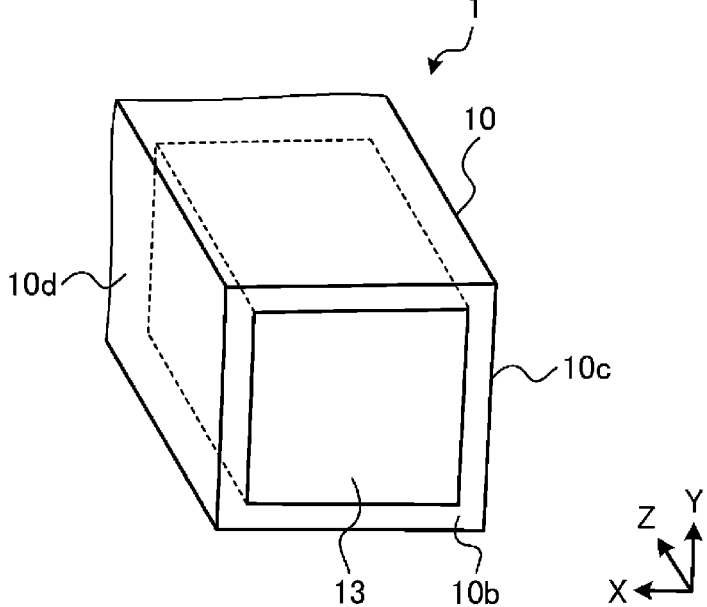
FIG. 6 is an enlarged perspective view illustrating a configuration of a base end portion side of the body portion according to the embodiment.
Figure 7:
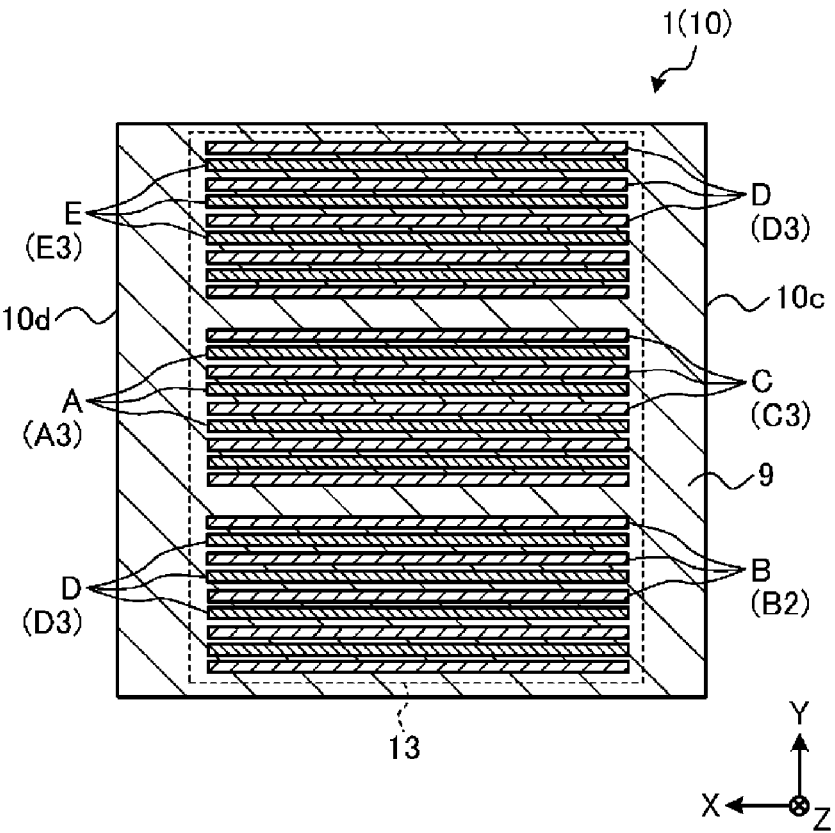
FIG. 7 is a cross-sectional view illustrating the configuration of the base end portion side of the body portion according to the embodiment.

FIG. 6 is an enlarged perspective view illustrating the configuration of the base end portion 10b side of the body portion 10 according to the embodiment, and FIG. 7 is a cross-sectional view illustrating the configuration of the base end portion 10b side of the body portion according to the embodiment. FIG. 7 is a cross-sectional view taken along line II-II of FIG. 1.

As illustrated in FIG. 6, the body portion 10 according to the embodiment includes a third piezoelectric element 13 in addition to the first piezoelectric element 11 and the second piezoelectric element 12 described above. The third piezoelectric element 13 is disposed from the center of the body portion 10 to the peripheral edge portion on the base end portion 10b side of the body portion 10. The third piezoelectric element 13 is a piezoelectric element that displaces the tip portion 10a of the body portion 10 in the Z-axis direction.

As illustrated in FIG. 7, the third piezoelectric element 13 is formed by layering the piezoelectric layer 9 and the internal electrode layers A to E in a predetermined order along the Y-axis direction. The layered structure of the third piezoelectric element 13 is the same as or similar to the layered structure of the first piezoelectric element 11 and the second piezoelectric element 12.

That is, as illustrated in FIG. 7, the piezoelectric layer 9, the internal electrode layer D, the piezoelectric layer 9, and the internal electrode layer E are repeatedly layered in this order from the Y-axis positive direction side in the body portion 10. Subsequently, the piezoelectric layer 9, the internal electrode layer C, the piezoelectric layer 9 and the internal electrode layer A are repeatedly layered in this order. Subsequently, the piezoelectric layer 9, the internal electrode layer B, the piezoelectric layer 9 and the internal electrode layer D are repeatedly layered in this order.

The third piezoelectric element 13 is composed of: a layered group including the piezoelectric layer 9, the internal electrode layer D3, and the internal electrode layer E3; a layered group including the piezoelectric layer 9, the internal electrode layer A3, and the internal electrode layer C3; and a layered group including the piezoelectric layer 9, the internal electrode layer B2, and the internal electrode layer D3.

In the piezoelectric actuator 1 having such an internal configuration, a predetermined drive voltage is supplied to the terminal 22 (see FIG. 1) and the terminal 25 (see FIG. 1). Accordingly, the drive voltage is applied between the internal electrode layer D3 and the internal electrode layer E3, the drive voltage is also applied between the internal electrode layer A3 and the internal electrode layer C3, and the drive voltage is also applied between the internal electrode layer B2 and the internal electrode layer D3.

That is, by supplying the drive voltage to the terminal 22 and the terminal 25, the drive voltage is applied to all the layered groups in the third piezoelectric element 13, and thus the third piezoelectric element 13 expands along the Y-axis direction and contracts along the Z-axis direction. As a result, in the piezoelectric actuator 1, the tip portion 10a of the body portion 10 is displaced in the Z-axis negative direction.

In this manner, in the embodiment, by selectively applying a voltage to the terminals 22 and 25, the tip portion 10a is independently displaced in the Z-axis direction.

As described above, in the piezoelectric actuator 1 according to the embodiment, the body portion 10 has the first piezoelectric element 11, the second piezoelectric element 12, and the third piezoelectric element 13, so that the tip portion 10a can be displaced in the X-axis direction, the Y-axis direction, and the Z-axis direction.

Therefore, according to the embodiment, the piezoelectric actuator 1 which is more user-friendly can be provided.

In the embodiment, as illustrated in FIGS. 5 and 7, the internal electrode layers A3, B2, C3, D3, and E3 belonging to the third piezoelectric element 13 are located in the same layer as the internal electrode layers A1, C1, C2 belonging to the first piezoelectric element 11 or the internal electrode layers B1, D1, E1 belonging to the second piezoelectric element 12.

As a result, the internal electrode layers A to E can be disposed on the entire surface of the piezoelectric layer 9 without deviation, distortion of the body portion 10 caused by the internal electrode layers A to E being disposed unevenly on a part of the piezoelectric layer 9 can be reduced.

Therefore, according to the embodiment, the displacement accuracy of the piezoelectric actuator 1 can be improved.

The piezoelectric actuator 1 according to the embodiment includes five terminals 21 to 25, and by selectively applying a voltage to the five terminals 21 to 25, the tip portion 10a is independently displaced in the X-axis direction, the Y-axis direction, and the Z-axis direction.

In this manner, according to the embodiment, in the piezoelectric actuator 1 in which the number of terminals is minimized, since the tip portion 10a can be independently displaced in the X-axis direction, the Y-axis direction, and the Z-axis direction, the piezoelectric actuator 1 which is more user-friendly can be provided.

In the embodiment, by minimizing the number of terminals, the stress applied to the terminal portion 20 upon the body portion 10 being deformed can be reduced.

In the embodiment, when the piezoelectric actuator 1 is incorporated into an external device or the like, the side of the base end portion 10b of the body portion 10 is held by a holding member (not illustrated). Thereby, the displacement accuracy of the tip portion 10a can be improved as compared with the case where the tip portion 10a side of the body portion 10 is held by the holding member.

Figure 8:
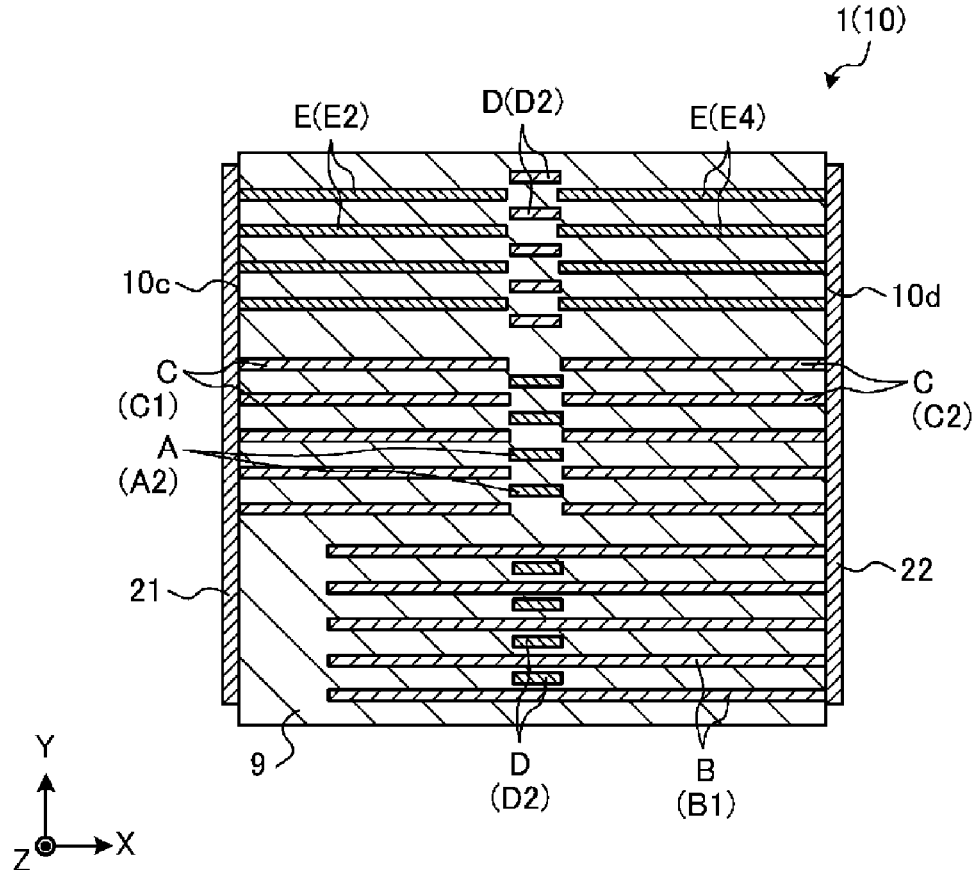
FIG. 8 is a cross-sectional view taken along line III-III in FIG. 1.

The internal configuration of the body portion 10 will be further described. FIG. 8 is a cross-sectional view taken along line III-III of FIG. 1, and is a cross-sectional view of a region between the terminal 21 and the terminal 22.

As illustrated in FIG. 8, the internal electrode layer E2 and the internal electrode layer C1 are electrically connected to the terminal 21 at the side surface 10c. The internal electrode layer E4, the internal electrode layer C2, and the internal electrode layer B1 are electrically connected to the terminal 22 at the side surface 10d.

Figure 9:
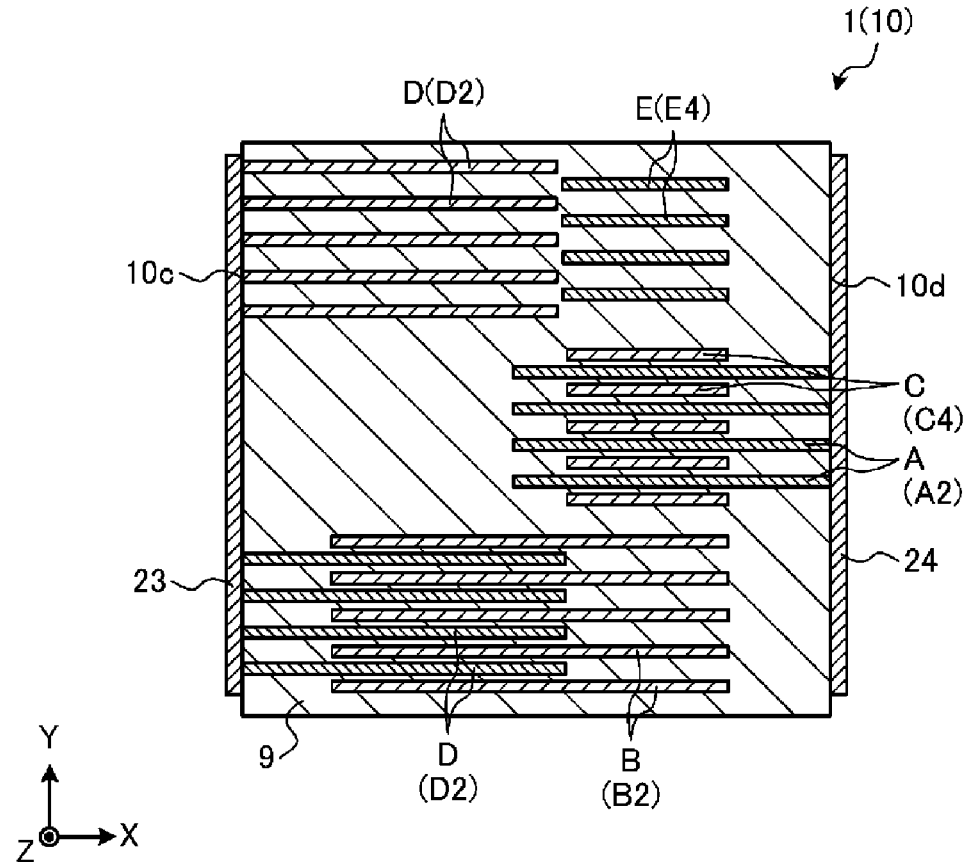
FIG. 9 is a cross-sectional view taken along line IV-IV in FIG. 1.

FIG. 9 is a cross-sectional view taken along line IV-IV of FIG. 1, and is a cross-sectional view of a region between the terminal 23 and the terminal 24. As illustrated in FIG. 9, the internal electrode layer D2 is electrically connected to the terminal 23 at the side surface 10c. The internal electrode layer A2 is electrically connected to the terminal 24 at the side surface 10d.

Figure 10:
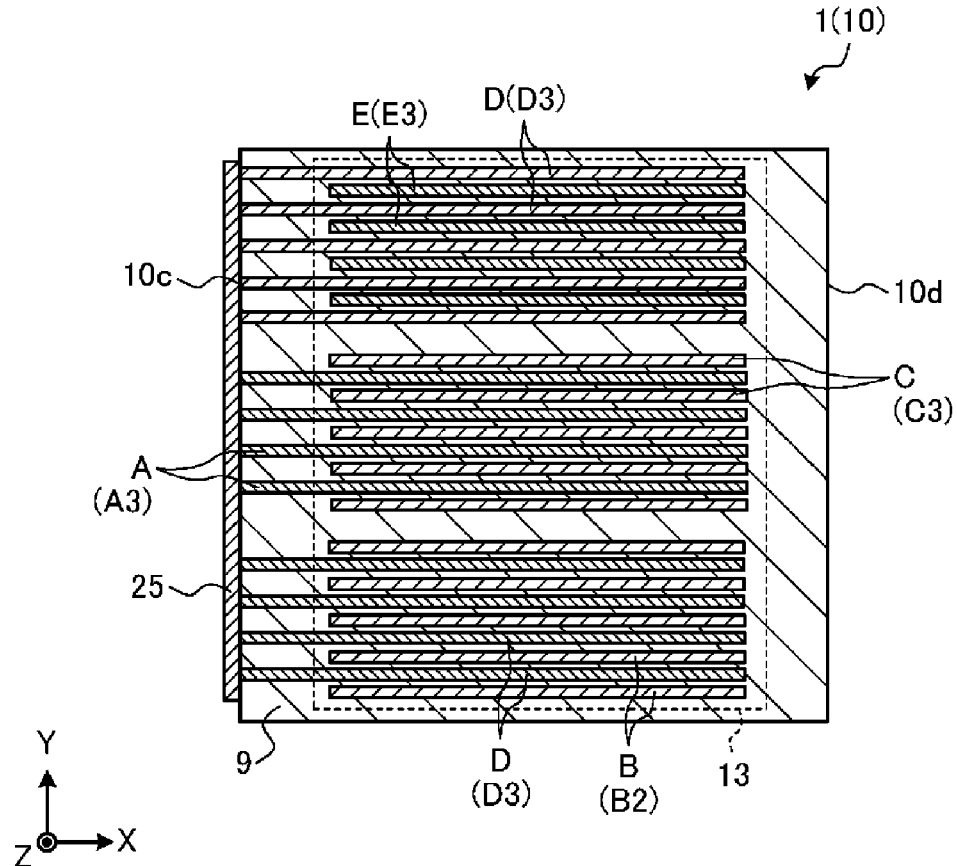
FIG. 10 is a cross-sectional view taken along line V-V in FIG. 1.

FIG. 10 is a cross-sectional view taken along line V-V of FIG. 1, and is a cross-sectional view of the terminal 25 and its vicinity. As illustrated in FIG. 10, the internal electrode layer D3 and the internal electrode layer A3 are electrically connected to the terminal 25 at the side surface 10c.

In the examples of FIGS. 8 to 10, examples in which the internal electrode layers A to E and the terminals 21 to 25 are directly connected to each other are illustrated, but a metallized layer may be disposed between the internal electrode layers A to E and the terminals 21 to 25, and the internal electrode layers A to E and the terminals 21 to 25 may be electrically connected to each other via the metallized layer.

Accordingly, the internal electrode layers A to E and the terminals 21 to 25 can be electrically connected to each other in a favorable manner.

Variation

Next, a variation of the embodiment will be described with reference to FIGS. 11 to 13E. In the variation described below, the same components as those in the embodiment are denoted by the same reference numerals, and redundant description may be omitted.

Figure 11:
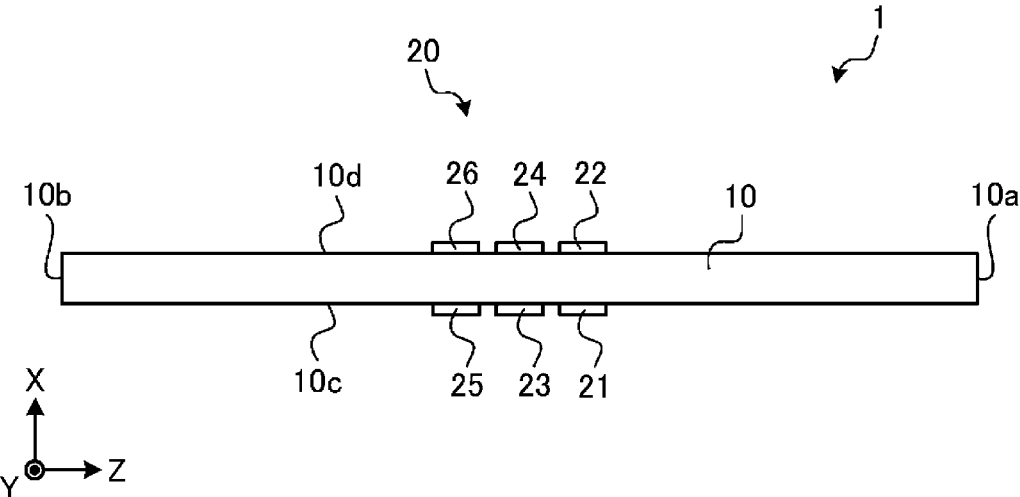
FIG. 11 is a top view illustrating an overall configuration of the piezoelectric actuator according to a variation of the embodiment.
Figure 12:
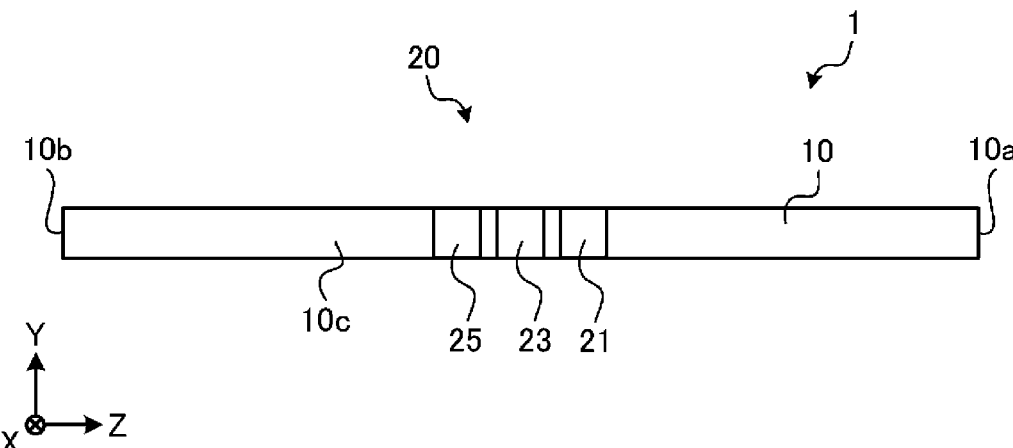
FIG. 12 is a side view illustrating an overall configuration of the piezoelectric actuator according to the variation of the embodiment.

FIG. 11 is a top view illustrating the overall configuration of the piezoelectric actuator 1 according to the variation of the embodiment, and FIG. 12 is a side view illustrating the overall configuration of the piezoelectric actuator 1 according to the variation of the embodiment.

In this variation, the number of terminals in the terminal portion 20 is different from that in the above-described embodiment. Specifically, the terminal portion 20 according to the variation includes six terminals 21 to 26. As illustrated in FIG. 11, the six terminals 21 to 26 are disposed in the vicinity of a central portion in the extending direction (that is, the Z-axis direction) of the body portion 10.

The terminals 21, 23, and 25 are disposed on the side surface 10c of the body portion 10 on the X-axis negative direction side, and the terminals 22, 24, and 26 are disposed on the side surface 10d of the body portion 10 on the X-axis positive direction side.

The terminals 21, 23, and 25 are disposed side by side in this order from the tip portion 10a side along the Z-axis direction, and the terminals 22, 24, and 26 are disposed side by side in this order from the tip portion 10a side along the Z-axis direction.

The terminal 21 and the terminal 22 are disposed side by side along the X-axis direction, the terminal 23 and the terminal 24 are disposed side by side along the X-axis direction, and the terminal 25 and the terminal 26 are disposed side by side along the X-axis direction.

Figure 13A:
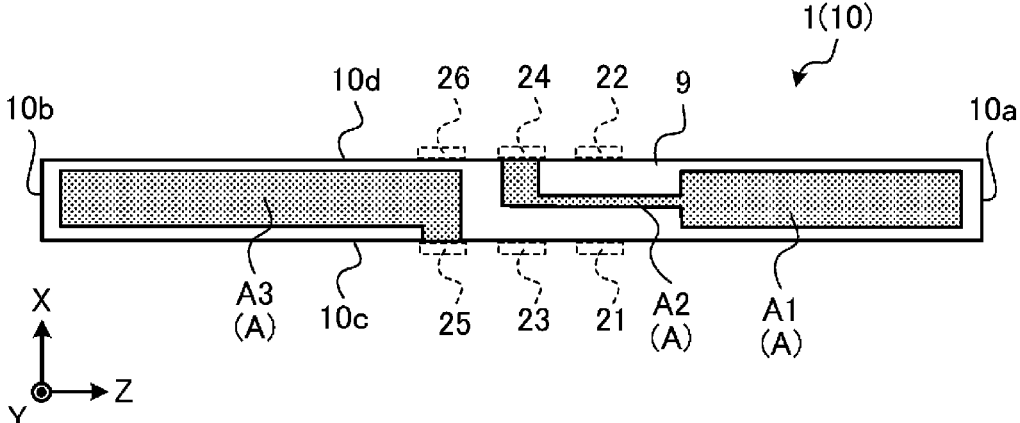
FIG. 13A is a view illustrating a configuration of an internal electrode layer of a body portion according to the variation of the embodiment.

FIG. 13A is a view illustrating the configuration of the internal electrode layer A of the body portion 10 according to the variation of the embodiment. As illustrated in FIG. 13A, the internal electrode layer A according to the variation is layered along the Y-axis direction on the rectangular piezoelectric layer 9 located along the XZ plane.

The internal electrode layer A according to the variation includes the internal electrode layers A1 to A3. The internal electrode layer A1 is a wide portion formed from the tip portion 10a to a position just before a portion where the terminals 21 and 22 are disposed. The internal electrode layer A1 extends, for example, from the vicinity of the side surface 10c to the vicinity of the side surface 10d in the X-axis direction.

The internal electrode layer A2 is a narrow portion extending from an end portion of the internal electrode layer A1 on the Z-axis negative direction side to the terminal 24, and electrically connects the internal electrode layer A1 and the terminal 24. The internal electrode layer A2 is located, for example, in an intermediate portion between the side surface 10*c* and the side surface in the X-axis direction.

The internal electrode layer A3 is a wide portion formed between a portion where the terminal 25 is disposed and the base end portion 10*b*, and is electrically connected to the terminal 25. The internal electrode layer A3 extends, for example, from the vicinity of the side surface 10*c* to the vicinity of the side surface 10*d* in the X-axis direction.

Figure 13B:
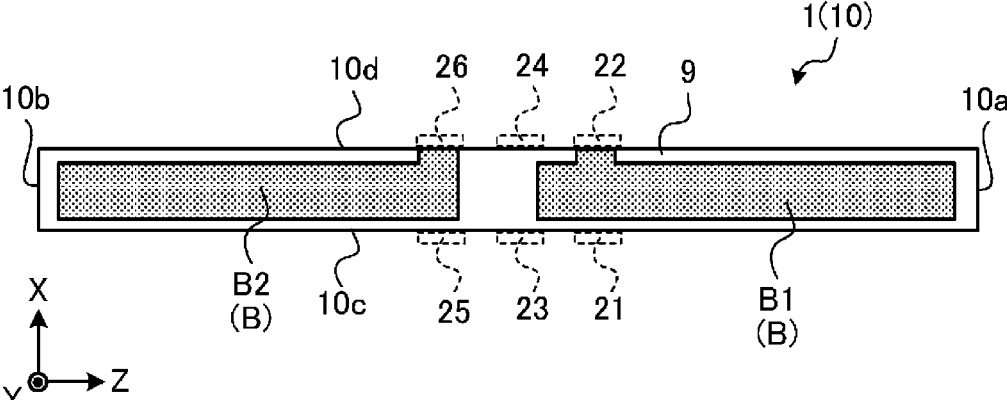
FIG. 13B is a view illustrating the configuration of the internal electrode layer of the body portion according to the variation of the embodiment.

FIG. 13B is a view illustrating the configuration of the internal electrode layer B of the body portion 10 according to the variation of the embodiment. As illustrated in FIG. 13B, the internal electrode layer B according to the variation is layered along the Y-axis direction on the rectangular piezoelectric layer 9 located along the XZ plane.

The internal electrode layer B according to the variation includes the internal electrode layers B1 and B2. The internal electrode layer B1 is a wide portion formed from the tip portion 10*a* to a portion where the terminals 21 and 22 are disposed, and is electrically connected to the terminal 22. The internal electrode layer B1 extends, for example, from the vicinity of the side surface 10*c* to the vicinity of the side surface 10*d* in the X-axis direction.

The internal electrode layer B2 is a wide portion formed between a portion where the terminals 25 and 26 are disposed and the base end portion 10*b*, and is electrically connected to the terminal 26. The internal electrode layer B2 extends, for example, from the vicinity of the side surface 10*c* to the vicinity of the side surface 10*d* in the X-axis direction.

Figure 13C:
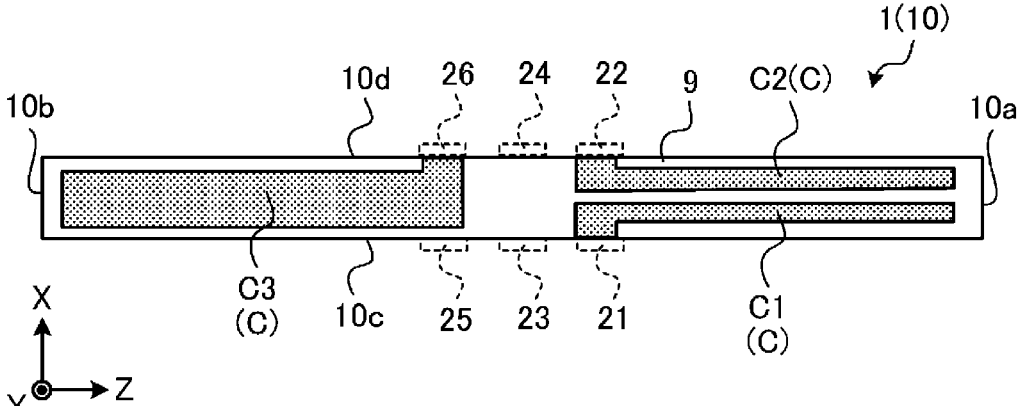
FIG. 13C is a view illustrating the configuration of the internal electrode layer of the body portion according to the variation of the embodiment.

FIG. 13C is a view illustrating the configuration of the internal electrode layer C of the body portion 10 according to the variation of the embodiment. As illustrated in FIG. 13C, the internal electrode layer C according to the variation is layered along the Y-axis direction on the rectangular piezoelectric layer 9 located along the XZ plane.

The internal electrode layer C according to the variation includes the internal electrode layers C1 to C3. The internal electrode layer C1 is a slightly narrow portion formed between the tip portion 10*a* and a portion where the terminals 21 and 22 are disposed, and is electrically connected to the terminal 21. The internal electrode layer C1 extends, for example, in the X-axis direction, from an intermediate portion between the side surface 10*c* and the side surface 10*d* to the vicinity of the side surface 10*c*.

The internal electrode layer C2 is a slightly narrow portion formed between the tip portion 10*a* and a portion where the terminals 21 and 22 are disposed, and is electrically connected to the terminal 22. The internal electrode layer C2 extends, for example, in the X-axis direction, from an intermediate portion between the side surface 10*c* and the side surface 10*d* to the vicinity of the side surface 10*d*.

The internal electrode layer C3 is a wide portion formed between a portion where the terminal 25 are disposed and the base end portion 10*b*, and is electrically connected to the terminal 26. The internal electrode layer C3 extends, for example, from the vicinity of the side surface 10*c* to the vicinity of the side surface 10*d* in the X-axis direction.

Figure 13D:
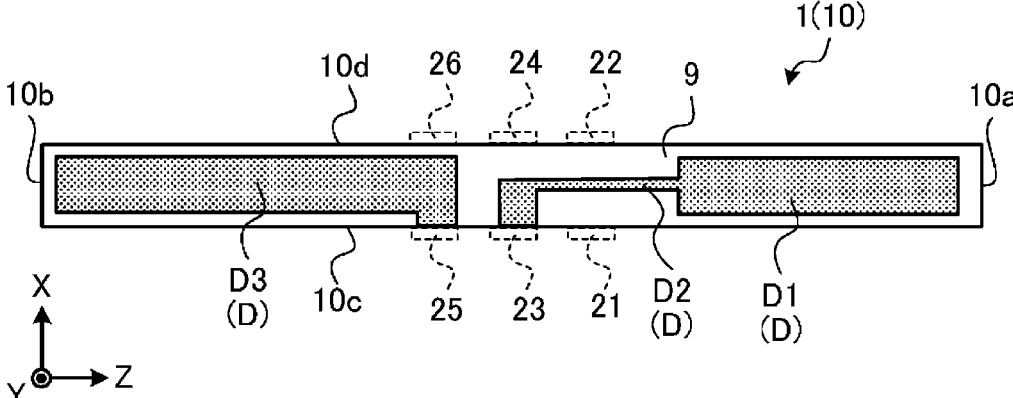
FIG. 13D is a view illustrating the configuration of the internal electrode layer of the body portion according to the variation of the embodiment.

FIG. 13D is a view illustrating the configuration of the internal electrode layer D of the body portion 10 according to the variation of the embodiment. As illustrated in FIG. 13D, the internal electrode layer D according to the variation is layered along the Y-axis direction on the rectangular piezoelectric layer 9 located along the XZ plane.

The internal electrode layer D according to the variation includes the internal electrode layers D1 to D3. The internal electrode layer D1 is a wide portion formed from the tip portion 10*a* to a position just before a portion where the terminals 21 and 22 are disposed. The internal electrode layer D1 extends, for example, from the vicinity of the side surface 10*c* to the vicinity of the side surface 10*d* in the X-axis direction.

The internal electrode layer D2 is a narrow portion extending from an end portion of the internal electrode layer D1 on the Z-axis negative direction side to the terminal 23, and electrically connects the internal electrode layer D1 and the terminal 23. The internal electrode layer D2 is located, for example, in an intermediate portion between the side surface 10*c* and the side surface 10*d* in the X-axis direction.

The internal electrode layer D3 is a wide portion formed between a portion where the terminal 25 is disposed and the base end portion 10*b*, and is electrically connected to the terminal 25. The internal electrode layer D3 extends, for example, from the vicinity of the side surface 10*c* to the vicinity of the side surface 10*d* in the X-axis direction.

Figure 13E:
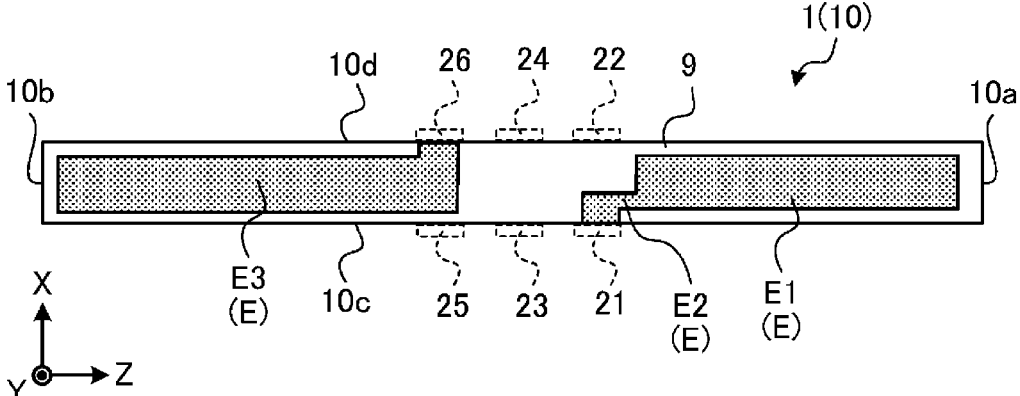
FIG. 13E is a view illustrating the configuration of the internal electrode layer of the body portion according to the variation of the embodiment.

FIG. 13E is a view illustrating the configuration of the internal electrode layer E of the body portion 10 according to the variation of the embodiment. As illustrated in FIG. 13E, the internal electrode layer E according to the variation is layered along the Y-axis direction on the rectangular piezoelectric layer 9 located along the XZ plane.

The internal electrode layer E according to the variation includes the internal electrode layers E1 to E3. The internal electrode layer E1 is a wide portion formed from the tip portion 10*a* to a position just before a portion where the terminals 21 and 22 are disposed. The internal electrode layer E1 extends, for example, from the vicinity of the side surface 10*c* to the vicinity of the side surface 10*d* in the X-axis direction.

The internal electrode layer E2 is a slightly narrow portion extending from an end portion of the internal electrode layer E1 on the Z-axis negative direction side to the terminal 21, and electrically connects the internal electrode layer E1 and the terminal 21. The internal electrode layer E2 extends, for example, in the X-axis direction, from an intermediate portion between the side surface 10*c* and the side surface 10*d* to the vicinity of the side surface 10*c*.

The internal electrode layer E3 is a wide portion formed between a portion where the terminals 25 and 26 are disposed and the base end portion 10*b*, and is electrically connected to the terminal 26. The internal electrode layer E3 extends, for example, from the vicinity of the side surface 10*c* to the vicinity of the side surface 10*d* in the X-axis direction.

Next, a variation of the body portion 10 including the piezoelectric layer 9 and the internal electrode layers A to E described above will be described. Since the configuration of the layered piezoelectric element according to the variation is the same as or similar to the configuration of the embodiment illustrated in FIGS. 4 to 7, the operation of each piezoelectric element in the variation will be described below with reference to FIGS. 4 to 7.

As illustrated in FIG. 5, the body portion 10 according to the variation is formed by layering the piezoelectric layer 9 and the internal electrode layers A to E in a predetermined order along the Y-axis direction. To be specific, the first element 12*a* of the second piezoelectric element 12 is formed by repeatedly layering the piezoelectric layer 9, the internal electrode layer D, the piezoelectric layer 9, and the internal electrode layer E in this order from the Y-axis positive direction side in the body portion 10. The first element 12a includes the piezoelectric layer 9, the internal electrode layer D1, and the internal electrode layer E1.

Following the first element 12a, the first element 11a and the second element 11b of the first piezoelectric element 11 are formed by repeatedly layering the piezoelectric layer 9, the internal electrode layer C, the piezoelectric layer 9, and the internal electrode layer A in this order.

The first element 11a includes the piezoelectric layer 9, the internal electrode layer C2, and the internal electrode layer A1. The second element 11b includes the piezoelectric layer 9, the internal electrode layer C1, and the internal electrode layer A1.

Further, following the first piezoelectric element 11, the second element 12b of the second piezoelectric element 12 is formed by repeatedly layering the piezoelectric layer 9, the internal electrode layer B, the piezoelectric layer 9, and the internal electrode layer D in this order. The second element 12b includes the piezoelectric layer 9, the internal electrode layer B1, and the internal electrode layer D1.

In the piezoelectric actuator 1 according to the variation, a predetermined drive voltage is supplied to the terminal 22 and the terminal 24, so that the drive voltage is applied between the internal electrode layer C2 and the internal electrode layer A1.

That is, by supplying a drive voltage to the terminals 22 and 24, the drive voltage is applied to the first element 11a of the first piezoelectric element 11 in which the internal electrode layer C2 and the internal electrode layer A1 are alternately layered. As a result, the first element 11a extends in the Y-axis direction and contracts in the Z-axis direction, so that in the piezoelectric actuator 1, the tip portion 10a of the body portion 10 is displaced to the X-axis positive direction side.

In the piezoelectric actuator 1 according to the variation, a predetermined drive voltage is supplied to the terminal 21 and the terminal 24, so that the drive voltage is applied between the internal electrode layer C1 and the internal electrode layer A1.

That is, by supplying a drive voltage to the terminals 21 and 24, the drive voltage is applied to the second element 11b of the first piezoelectric element 11 in which the internal electrode layer C1 and the internal electrode layer A1 are alternately layered. As a result, the second element 11b extends in the Y-axis direction and contracts in the Z-axis direction, so that in the piezoelectric actuator 1, the tip portion 10a of the body portion 10 is displaced to the X-axis negative direction side.

In this manner, in the variation, by selectively applying a voltage to the terminals 21, 22, and 24, the tip portion 10a is independently displaced in the X-axis direction.

In the piezoelectric actuator 1 according to the variation, a predetermined drive voltage is supplied to the terminal 21 and the terminal 23, so that the drive voltage is applied between the internal electrode layer D1 and the internal electrode layer E1.

That is, by supplying a drive voltage to the terminals 21 and 23, the drive voltage is applied to the first element 12a of the second piezoelectric element 12 in which the internal electrode layer D1 and the internal electrode layer E1 are alternately layered. As a result, the first element 12a extends in the Y-axis direction and contracts in the Z-axis direction, so that in the piezoelectric actuator 1, the tip portion 10a of the body portion 10 is displaced to the Y-axis positive direction side.

In the piezoelectric actuator 1 according to the variation, a predetermined drive voltage is supplied to the terminal 22 and the terminal 23, so that the drive voltage is applied between the internal electrode layer B1 and the internal electrode layer D1.

That is, by supplying a drive voltage to the terminals 22 and 23, the drive voltage is applied to the second element 12b of the second piezoelectric element 12 in which the internal electrode layer B1 and the internal electrode layer D1 are alternately layered. As a result, the second element 12b extends in the Y-axis direction and contracts in the Z-axis direction, so that in the piezoelectric actuator 1, the tip portion 10a of the body portion 10 is displaced in the Y-axis negative direction.

In this manner, in the variation, by selectively applying a voltage to the terminals 21 to 23, the tip portion 10a is independently displaced in the Y-axis direction.

As illustrated in FIG. 7, the third piezoelectric element 13 according to the variation is formed by layering the piezoelectric layer 9 and the internal electrode layers A to E in a predetermined order along the Y-axis direction. The layered structure of the third piezoelectric element 13 is the same as or similar to the layered structure of the first piezoelectric element 11 and the second piezoelectric element 12.

That is, as illustrated in FIG. 7, the piezoelectric layer 9, the internal electrode layer D, the piezoelectric layer 9, and the internal electrode layer E are repeatedly layered in this order from the Y-axis positive direction side in the body portion 10. Subsequently, the piezoelectric layer 9, the internal electrode layer C, the piezoelectric layer 9 and the internal electrode layer A are repeatedly layered in this order. Subsequently, the piezoelectric layer 9, the internal electrode layer B, the piezoelectric layer 9 and the internal electrode layer D are repeatedly layered in this order.

The third piezoelectric element 13 according to the variation is composed of: a layered group including the piezoelectric layer 9, the internal electrode layer D3, and the internal electrode layer E3; a layered group including the piezoelectric layer 9, the internal electrode layer A3, and the internal electrode layer C3; and a layered group including the piezoelectric layer 9, the internal electrode layer B2, and the internal electrode layer D3.

In the piezoelectric actuator 1 according to the variation, a predetermined drive voltage is supplied to the terminal 25 and the terminal 26. Accordingly, the drive voltage is applied between the internal electrode layer D3 and the internal electrode layer E3, the drive voltage is also applied between the internal electrode layer A3 and the internal electrode layer C3, and the drive voltage is also applied between the internal electrode layer B2 and the internal electrode layer D3.

That is, by supplying the drive voltage to the terminal 25 and the terminal 26, the drive voltage is applied to all the layered groups in the third piezoelectric element 13, and thus the third piezoelectric element 13 expands along the Y-axis direction and contracts along the Z-axis direction. As a result, in the piezoelectric actuator 1, the tip portion 10a of the body portion 10 is displaced in the Z-axis negative direction.

In this manner, in the variation, by selectively applying a voltage to the terminals 25 and 26, the tip portion 10a is independently displaced in the Z-axis direction.

As described above, in the piezoelectric actuator 1 according to the variation, the tip portion 10a is independently displaced in the X-axis direction, the Y-axis direction, and the Z-axis direction by selectively applying a voltage to the six terminals 21 to 26. Accordingly, the piezoelectric actuator 1 which is more user-friendly can be provided.

In the variation, the internal electrode layers A3, B2, C3, D3, and E3 belonging to the third piezoelectric element 13 are located in the same layer as the internal electrode layers A1, C1, and C2 belonging to the first piezoelectric element 11 or the internal electrode layers B1, D1, and E1 belonging to the second piezoelectric element 12.

As a result, the internal electrode layers A to E can be disposed on the entire surface of the piezoelectric layer 9 without deviation, distortion of the body portion 10 caused by the internal electrode layers A to E being disposed unevenly on a part of the piezoelectric layer 9 can be reduced.

Therefore, according to the variation, the displacement accuracy of the piezoelectric actuator 1 can be improved.

In the variation, when the piezoelectric actuator 1 is incorporated into an external device or the like, the side of the base end portion 10b of the body portion 10 is held by a holding member (not illustrated). Thereby, the displacement accuracy of the tip portion 10a can be improved as compared with the case where the tip portion 10a side of the body portion 10 is held by the holding member.

The piezoelectric actuator 1 according to the embodiment includes the body portion 10 including a layered piezoelectric element layered in a Y-axis direction of an orthogonal coordinate system XYZ, the body portion 10 extending along a Z-axis direction. The body portion 10 includes a first piezoelectric element 11 that displaces a tip portion 10a in an X-axis direction, a second piezoelectric element 12 that displaces the tip portion 10a in the Y-axis direction, and a third piezoelectric element 13 that displaces the tip portion 10a in the Z-axis direction. Accordingly, the piezoelectric actuator 1 which is more user-friendly can be provided.

In the piezoelectric actuator 1 according to the embodiment, the internal electrode layers A3, B2, C3, D3, and E3 belonging to the third piezoelectric element 13 are located in the same layer as the internal electrode layers A1, C1, and C2 belonging to the first piezoelectric element 11 or the internal electrode layers B1, D1, and E1 belonging to the second piezoelectric element 12. Thus, the displacement accuracy of the piezoelectric actuator 1 can be improved.

The piezoelectric actuator 1 according to the embodiment further includes five terminals 21 to 25 that apply a voltage to at least one selected from the group consisting of the first piezoelectric element 11, the second piezoelectric element 12, and the third piezoelectric element 13. The tip portion 10a is independently displaced in the X-axis direction, the Y-axis direction, and the Z-axis direction by selectively applying a voltage to the five terminals 21 to 25. Accordingly, the piezoelectric actuator 1 which is more user-friendly can be provided.

In the piezoelectric actuator 1 according to the embodiment, the third piezoelectric element 13 is located closer to the base end portion 10b side of the body portion 10 than the first piezoelectric element 11 and the second piezoelectric element 12. The base end portion 10b side of the body portion 10 is held by the holding member. Thus, the displacement accuracy of the piezoelectric actuator 1 can be improved.

Although the embodiments of the present disclosure have been described above, the present disclosure is not limited to the embodiments described above, and various modifications can be made without departing from the spirit thereof. For example, in the above-described embodiment, a case where the body portion 10 has a rectangular parallelepiped shape has been described, but the body portion 10 is not limited to the rectangular parallelepiped shape, and may have a cylindrical shape, a polygonal columnar shape, or the like.

Additional effects and other aspects can be easily derived by a person skilled in the art. Thus, a wide variety of aspects of the present disclosure are not limited to the specific details and representative embodiments represented and described above. Accordingly, various changes are possible without departing from the spirit or scope of the general inventive concepts defined by the appended claims and their equivalents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A piezoelectric actuator comprising:
   a body portion comprising a layered piezoelectric element layered in a Y-axis direction of an orthogonal coordinate system XYZ, the body portion extending along a Z-axis direction, wherein
   the body portion comprises:
   a first piezoelectric element configured to displace a tip portion in an X-axis direction;
   a second piezoelectric element configured to displace the tip portion in the Y-axis direction; and
   a third piezoelectric element configured to displace the tip portion in the Z-axis direction.

2. The piezoelectric actuator according to claim 1, wherein
   an internal electrode layer belonging to the third piezoelectric element is located in a layer identical to an internal electrode layer belonging to the first piezoelectric element or an internal electrode layer belonging to the second piezoelectric element.

3. The piezoelectric actuator according to claim 1, further comprising:
   five terminals configured to apply a voltage to at least one selected from the group consisting of the first piezoelectric element, the second piezoelectric element, and the third piezoelectric element, wherein
   the tip portion is independently displaced in the X-axis direction, the Y-axis direction, and the Z-axis direction by selectively applying a voltage to the five terminals.

4. The piezoelectric actuator according to claim 1, wherein
   the third piezoelectric element is located closer to a base end portion side of the body portion than the first piezoelectric element and the second piezoelectric element, and
   the base end portion side of the body portion is held by a holding member.

* * * * *